(12) United States Patent
Sawamura

(10) Patent No.: US 6,436,789 B2
(45) Date of Patent: *Aug. 20, 2002

(54) METHOD OF FORMING A DEVICE SEPARATION REGION

(75) Inventor: Kenji Sawamura, Tokyo (JP)

(73) Assignee: Oki Electric Industry Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/298,906

(22) Filed: Apr. 26, 1999

(30) Foreign Application Priority Data

Jul. 24, 1998 (JP) .......................... 10-209467

(51) Int. Cl.[7] .............................. H01L 21/76
(52) U.S. Cl. ...................... 438/424; 438/427
(58) Field of Search ................. 438/401, 424, 438/427

(56) References Cited

U.S. PATENT DOCUMENTS

| | | | | |
|---|---|---|---|---|
| 4,374,011 A | * | 2/1983 | Vora et al. .................. | 438/424 |
| 5,385,861 A | * | 1/1995 | Bashir et al. ............... | 438/424 |
| 5,665,202 A | * | 9/1997 | Subramanian et al. ...... | 438/427 |
| 5,721,173 A | * | 2/1998 | Yano et al. ................. | 438/424 |
| 5,786,260 A | * | 7/1998 | Jang et al. .................. | 438/401 |
| 5,804,490 A | * | 9/1998 | Fiegl et al. ................. | 438/424 |
| 5,817,567 A | * | 10/1998 | Jang et al. .................. | 438/427 |
| 5,851,899 A | * | 12/1998 | Weigland .................... | 438/427 |
| 5,943,590 A | * | 8/1999 | Wang et al. ................ | 438/424 |
| 5,998,279 A | * | 12/1999 | Liaw .......................... | 438/424 |
| 6,004,863 A | * | 12/1999 | Jang .......................... | 438/427 |
| 6,043,133 A | * | 3/2000 | Jang et al. .................. | 438/401 |
| 6,063,702 A | * | 5/2000 | Chung ........................ | 438/427 |
| 6,117,740 A | * | 9/2000 | Lin et al. ................... | 438/296 |
| 6,124,183 A | * | 9/2000 | Karlsson et al. ........... | 438/427 |

FOREIGN PATENT DOCUMENTS

JP         9-102539         4/1997

* cited by examiner

Primary Examiner—Olik Chaudhuri
Assistant Examiner—David S Blum
(74) Attorney, Agent, or Firm—Volentine Francos, PLLC

(57) ABSTRACT

A plurality of trenches are formed in a semiconductor substrate, and an insulating film is formed over the plurality of trenches and the semiconductor substrate. A resist layer is then formed over the insulating film. The resist layer is then patterned such that remaining portions of the resist layer extend over first trenches of at least a given width and such that removed portions of the resist layer extend over second trenches of less then the given width. The insulating film is then etched using the remaining portions of the resist layer as a mask to expose the second trenches. The remaining portions of the resist layer are then removed to expose portions of the insulating film protruding above the first trenches. The exposed portions of the insulating film protruding above the first trenches is then chemical mechanical polished.

5 Claims, 2 Drawing Sheets

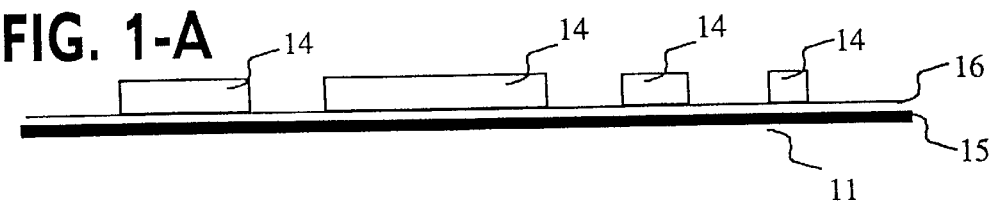
FIG. 1-A
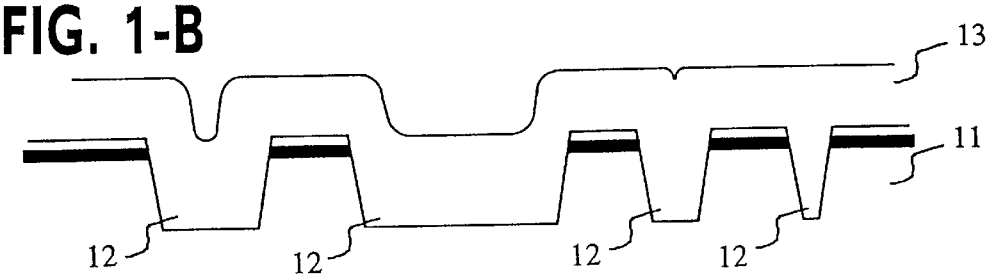
FIG. 1-B
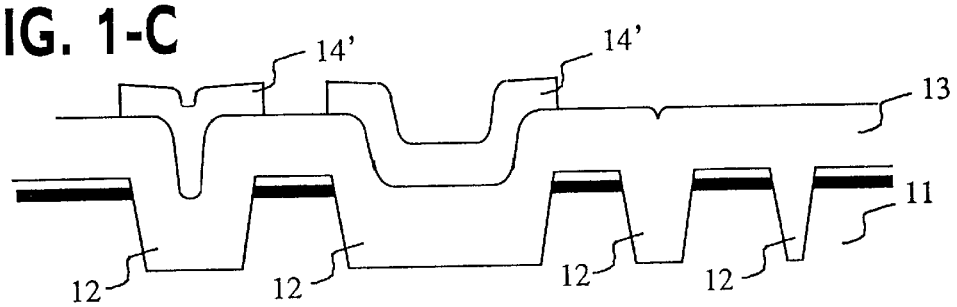
FIG. 1-C
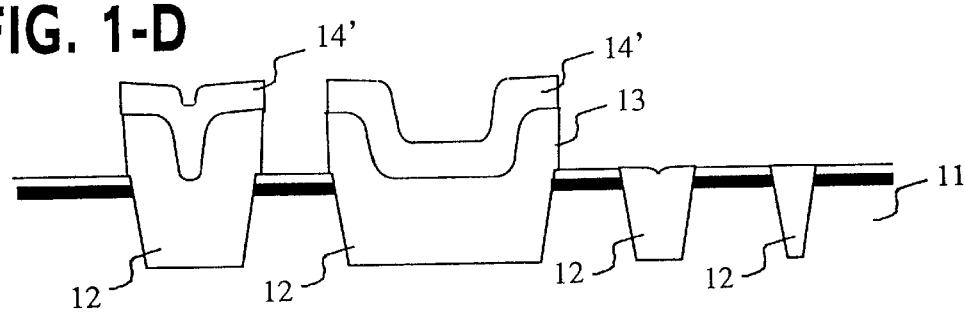
FIG. 1-D
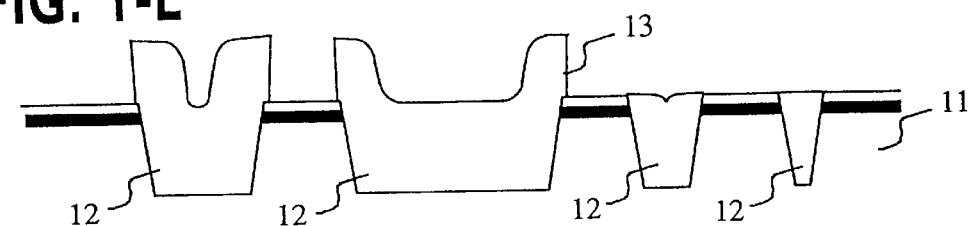
FIG. 1-E
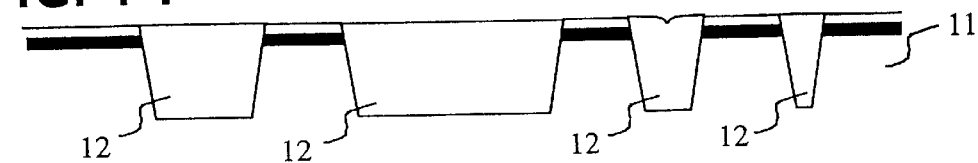
FIG. 1-F

FIG. 2-A
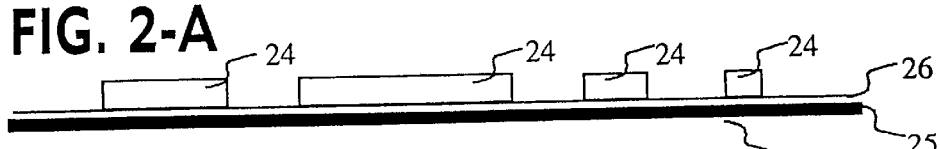
FIG. 2-B
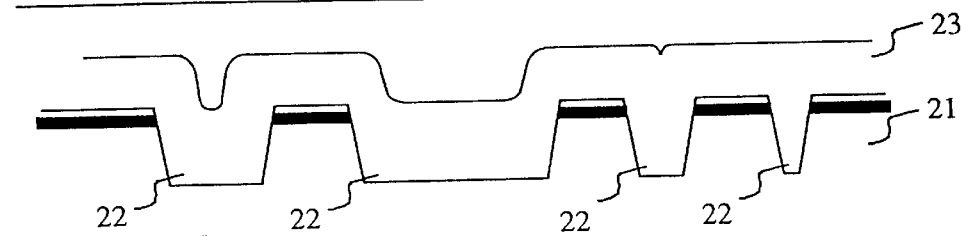
FIG. 2-C
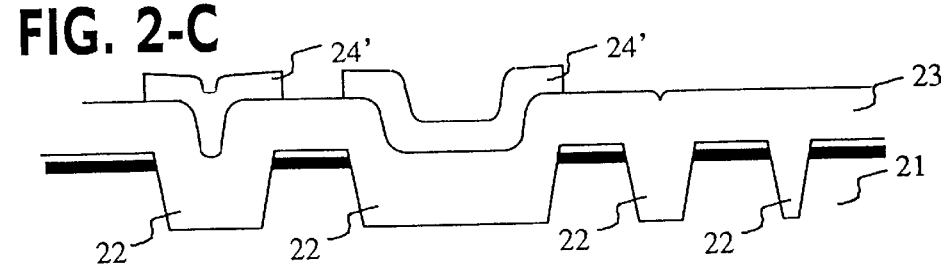
FIG. 2-D
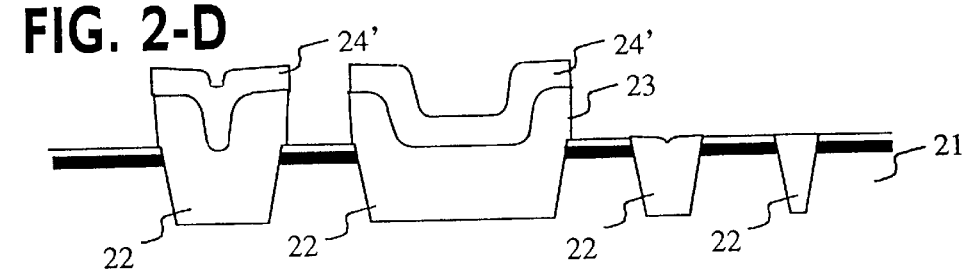
FIG. 2-E
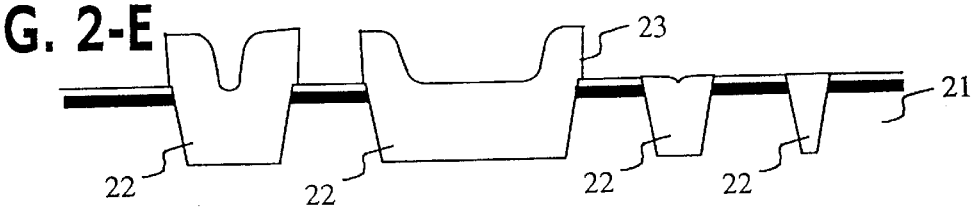
FIG. 2-F
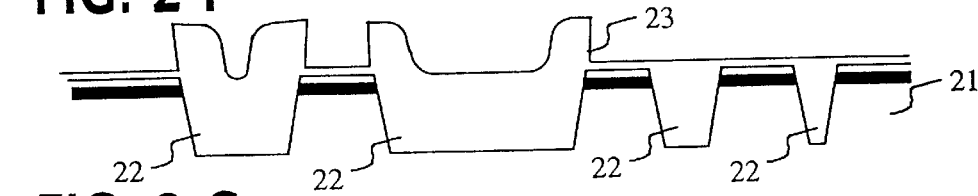
FIG. 2-G
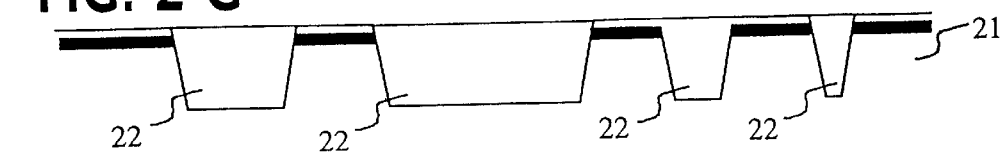

METHOD OF FORMING A DEVICE SEPARATION REGION

BACKGROUND OF THE INVENTION

1. Field of the Invention

This invention relates to a method of manufacturing a semiconductor device, and particularly to the formation of an embedded portion such as a device separation region or the like.

2. Description of the Related Art

Attention has been focused on a device separation technique using trenches as a technique for forming device separation regions employed in a semiconductor device.

A conventional process for forming device separation regions using trenches has been disclosed in Japanese Patent Application Laid-Open No. Hei 9-102539.

In the conventional device separation region forming method, resists are left above portions where the trenches are defined, regardless of the widths of device separation regions to be formed. A silicon oxide film has been etched with the resists as masks.

With advances in miniaturization of a semiconductor element or chip, leaving resists on trenches extremely narrow in width is becoming extremely difficult.

The formation of resist patterns over a silicon oxide film encounters difficulties in accurately aligning masks over the pre-formed trenches in regions above the trenches narrow in width. There is a possibility that when a displacement in alignment occurs even slightly, the resists and trenches will be shifted in position from each other on the trenches extremely narrow in width.

SUMMARY OF THE INVENTION

An object of the present invention is to solve the above-described problems.

According to one aspect of this invention, for achieving the above object, there is provided a method for forming a device separation region, comprising the following steps:

a step for forming a plurality of trenches each serving as the device separation region over a semiconductor substrate;

a step for forming an insulating film over the plurality of trenches and the semiconductor substrate;

a step for forming resists over the insulating film;

a step for leaving only the resists formed above the trenches each having a width larger than a predetermined width, of the plurality of trenches;

a step for removing the insulating film by etching with the remaining resists as masks; and a step for removing the remaining insulating film by chemical machine polishing after the removal of the remaining resists and forming the trenches buried by the insulating film.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 1-A through 1-F is a process diagram showing process steps employed in a method for forming a device separation region, according to a first embodiment of the present invention; and FIGS. 2-A through 2-G is a process diagram illustrating process steps employed in a method for forming a device separation region, according to a second embodiment of the present invention.

DESCRIPTION OF THE PREFERRED EMBODIMENTS

Preferred embodiments of the present invention will hereinafter be described in detail with reference to the accompanying drawings.

(First Embodiment)

FIG. 1 is a diagram showing a method for forming buried or embedded portions, according to a first embodiment of the present invention. The first embodiment of the present invention will be described below with reference to FIG. 1.

A PAD oxide film 15 having a thickness of about 2000 Å is formed over a semiconductor substrate 11 by CVD. Thereafter, an SiN film 16 having thicknesses ranging from about 500 Å to 5000 Å is formed thereon by CVD in the same manner as described above. Afterwards, a resist is applied over the entire surface of the SiN film 16 and resists 14 are patterned by using a mask having patterns for trench forming portions (see FIG. 1-A).

With the resists 14 as masks, the SiN film 16 and the PAD oxide film 15 are plasma-etched to open portions for forming trenches.

Thereafter, the silicon substrate 11 is etched to form trench portions or trenches 12. The trenches formed at this time range from 2500 Å to 5000 Å in depth and have shapes with slight tapered or cone angles ranging from about 70° to 90° as angles in the vicinity of the surface of the silicon substrate 11. Namely, each trench 12 is formed such that the width of an opening thereof is slightly wider than that of the bottom. Thus, the tapered angles are formed in the trenches 12 to sufficiently embed the oxide film up to the neighborhood of the bottoms of the trenches 12 in the subsequent oxide-film embedding process step.

Thereafter, a buried oxide film 13 having a thickness of about 10000 Å is formed over the entire surface of the wafer. According to this process step, the oxide film 13 is embedded in the trenches 12 (see FIG. 1-B).

Resists 14' are formed only over their corresponding trenches each having a width of 0.8 μm or more by using masks different from the above-described masks (see FIG. 1-C). In other words, the two trenches 12 on the left side of the figures have widths exceeding 0.8 μm, and the two trenches 12 on the right side of the figures have widths which are less than 0.8 μm.

Thereafter, the buried oxide film 13 is removed by etching up to the neighborhood of the surface of the SiN film 16 (see FIG. 1-D) with the resists 14' as the masks.

After its etching, the resists 14', which remain on the trenches each having the width of 0.8 μ or more, are removed (see FIG. 1-E).

The buried oxide film 13, which is left over each trench large in width, is polished up to the surface of the SiN film 16 by chemical machine polishing (CMP). Thereafter, a trench device separation forming process is finished (see FIG. 1-F).

According to the device separation region forming method of the present invention, such additional masks as to avoid the resists 14' from being left on the trenches narrow in width are created. Thus, although it is necessary to create the additional masks, a margin for mask misalignment or the like increases.

Further, the resists 14' are respectively left on the trenches broad in width and the buried oxide films 13 are etched with the resists 14' as the masks. When the buried oxide film 13 is etched without having to use any mask, the buried oxide film 13 on each trench broad in width is excessively etched so that the sufficient thickness of the oxide film cannot be maintained in the vicinity of the center of each trench. This state varies depending on to which thickness the buried oxide film 13 should be formed. According to the experiences of the present inventors, when a buried oxide film on a trench having such a width as to exceed about 80 percent of the thickness of the buried oxide film 13 is removed by etching, it has been confirmed that the buried oxide film located in the neighborhood of the center of the trench would take an excessively etched-shape. Thus, according to the present invention, the buried oxide film 13 on each trench having the width of 0.8 µm or more is polished and removed by using CMP. As a result, there is no fear of the buried oxide film on each wide trench being excessively etched in the vicinity of the center thereof.

(Second Embodiment)

FIG. 2 is a diagram showing a method for forming embedded portions, according to a second embodiment of the present invention. The second embodiment is similar to the first embodiment in process steps up to a process step for removing buried oxide films 23 by etching (see FIGS. 2-A through 2-D).

After the etching thereof, resists 24' left on trenches each having a width of 0.8 µm or more are removed (see FIG. 2-E).

In the embodiment of the present invention, no resists serving as masks with respect to etching exist on trenches narrow in width. In this case, concave portions might be formed in the central portions of the trenches as shown in FIG. 2-E although they are extremely small. Therefore, a CVD oxide film 27 of about several tens of Å is formed over the entire surface of a substrate in the second embodiment after the removal of the resists 24' (see FIG. 2-F).

Owing to this process step, there is no danger of the concave portions being formed even on the trenches in which the resists 24' serving as the masks did not exist. Thereafter, the remaining buried oxide films 23 are polished to the surface of an SiN film by Chemical Machine Polishing (CMP), followed by completion of a process step for forming trench device separation (see FIG. 2-G).

According to the device separation region forming method of the second embodiment of the present invention, since the CVD oxide film 27 of about several tens of Å is formed over the entire surface of the substrate after the removal of the resists 24' in addition to the effects described in the first embodiment, there is no possibility of the concave portions being formed even on the trenches with no resists 24' serving as the masks.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method for forming a device separation region, comprising:

forming a plurality of trenches in a semiconductor substrate, said plurality of trenches including first trenches each having a width which is greater than a given width and second trenches each having a width which is less than the given width;

forming a first insulating film over said plurality of trenches and said semiconductor substrate;

forming a resist layer on said first insulating film;

patterning said resist layer such that remaining portions of said resist layer extend over said first trenches and such that removed portions of said resist layer extend completely over said second trenches;

forming second device separating regions by etching said first insulating film using said remaining portions of said resist layer as a mask to expose said second trenches, wherein said second device separation regions are respectively defined by said second trenches containing said first insulating film;

removing said remaining portions of said resist layer to expose portions of said first insulating film protruding above said first trenches;

forming a second insulating film over the second trenches and the exposed portions of the first insulating film; and forming first device separation regions by chemical mechanical polishing said second insulating film and the exposed portions of said first insulating film protruding above said first trenches, wherein said first device separation regions are respectively defined by said first trenches containing said first insulating film;

wherein said given width is 80 percent of a thickness of said first insulating film.

2. The method according to claim 1, wherein said first and second insulating films are oxide films.

3. The method according to claim 1, wherein an opening of each of said plurality of trenches is wider than a bottom thereof.

4. The method according to claim 1, wherein sidewalls of each of said plurality of trenches are tapered relative to a surface of said semiconductor substrate.

5. The method according to claim 4, wherein the sidewalls are tapered in a range from above 70° to less than 90° relative to the surface of said semiconductor substrate.

* * * * *